(12) United States Patent
Zhong et al.

(10) Patent No.: US 11,769,679 B2
(45) Date of Patent: Sep. 26, 2023

(54) APPARATUS AND METHOD FOR IMPROVING FILM THICKNESS UNIFORMITY

(71) Applicant: SHANGHAI IC R&D CENTER CO., LTD., Shanghai (CN)

(72) Inventors: Xiaolan Zhong, Shanghai (CN); Xiaoxu Kang, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 727 days.

(21) Appl. No.: 16/966,508

(22) PCT Filed: Aug. 29, 2018

(86) PCT No.: PCT/CN2018/102893
§ 371 (c)(1),
(2) Date: Jul. 31, 2020

(87) PCT Pub. No.: WO2019/148823
PCT Pub. Date: Aug. 8, 2019

(65) Prior Publication Data
US 2021/0043483 A1 Feb. 11, 2021

(30) Foreign Application Priority Data
Jan. 31, 2018 (CN) .......................... 201810093937.6

(51) Int. Cl.
*H01L 21/67* (2006.01)
*C23C 16/455* (2006.01)
(Continued)

(52) U.S. Cl.
CPC .... *H01L 21/67253* (2013.01); *C23C 16/4584* (2013.01); *C23C 16/45536* (2013.01);
(Continued)

(58) Field of Classification Search
None
See application file for complete search history.

(56) References Cited

U.S. PATENT DOCUMENTS

| 5,763,010 A * | 6/1998 | Guo ................. H01L 21/76828 |
| | | 427/404 |
| 2006/0019031 A1* | 1/2006 | Furuta ................. C23C 16/0209 |
| | | 427/248.1 |
| 2017/0178898 A1* | 6/2017 | Kang ................. H01L 21/0262 |

FOREIGN PATENT DOCUMENTS

| CN | 101481795 A1 | 7/2009 |
| CN | 101527254 A1 | 9/2009 |

(Continued)

*Primary Examiner* — Michael Lebentritt
(74) *Attorney, Agent, or Firm* — TIANCHEN LLC.; Yuan R. Li; Yi Fan Yin

(57) ABSTRACT

The present disclosure relates to an apparatus and a method for improving film thickness uniformity, wherein a PECVD machine with twin chambers comprise a wafer heating platform, which is set to be a rotating platform with programmable speed control, by setting rotating speed of the platform, wafer is rotated for integral rounds within process time, so that a RF overlap between the twin chambers make consistent influence on edge regions of the wafer, and film around the wafer is evenly distributed, which not only eliminate abrupt change of film thickness caused by the RF overlap, but also reduce film thickness differences between edge regions and central regions of the film by a characteristic that the RF overlap improves film deposition rate, so as to ensure the film thickness more evenly in the range of the whole wafer.

15 Claims, 3 Drawing Sheets

(51) Int. Cl.
*C23C 16/458* (2006.01)
*C23C 16/505* (2006.01)
*C23C 16/52* (2006.01)
*H01L 21/02* (2006.01)

(52) U.S. Cl.
CPC ............ *C23C 16/505* (2013.01); *C23C 16/52* (2013.01); *H01L 21/02274* (2013.01); *H01L 21/67017* (2013.01)

(56) References Cited

FOREIGN PATENT DOCUMENTS

| | | | | |
|---|---|---|---|---|
| TW | 201709404 A | * | 3/2017 | ............. C23C 14/32 |
| WO | WO-2014066541 A1 | * | 5/2014 | ....... C23C 16/45565 |
| WO | WO-2018075225 A1 | * | 4/2018 | ....... G02F 1/133502 |

* cited by examiner

---the prior art---

---the prior art---

---the prior art---

APPARATUS AND METHOD FOR IMPROVING FILM THICKNESS UNIFORMITY

CROSS-REFERENCE TO RELATED APPLICATION

This application claims priority of International Patent Application Serial No. PCT/CN2018/102893, filed Aug. 29, 2018, which is related to and claims priority of Chinese patent application Serial No. 201810093937.6, filed Jan. 31, 2018. The entirety of each of the above-mentioned patent applications is hereby incorporated herein by reference and made a part of this specification.

TECHNICAL FIELD

The disclosure relates to the technical field of semiconductor integrated circuit manufacturing, in particular to an apparatus and a method for improving film thickness uniformity.

BACKGROUND

PECVD (Plasma Enhanced Chemical Vapor Deposition) ionizes gases containing film atoms by microwave or RF (Radio Frequency) to form plasma locally, through diffusion, adsorption, surface reaction, by-product desorption, gas exhausting and other processes, growth process of the film required is completed.

Due to high chemical activity of the plasma, chemical reaction of PECVD can be carried out at a lower temperature. In production process, film uniformity affects qualities of products greatly, so good film uniformity is very important. The film uniformity is mainly affected by plasma density distribution, which is related to discharge power, frequency, pressure and other factors.

Refer to FIG. 1, which is a diagram of reaction chambers of an existing PECVD machine. As shown in FIG. 1, in order to improve PECVD production capacity, twin chambers 10 and 20 are adopted in prior art, chamber A10 and chamber B20 are coupled and adopted, Each chamber of A and B are respectively provided with a gas spray head 13 and 23, a RF generator 14 and 24, and gas pipelines 30 and 31 of the two chambers are connected. During process, gas flow and pressure of the two chambers 10 and 20 are set to be the same; turning on RF generators 14 and 24, gas molecules are ionized to produce plasmas, and the plasmas with high chemical activity react on surface of wafers 12 and 22 on wafer heating platforms 11 and 21 to form films with required composition.

However, the close connection and incomplete RF shielding between the twin chambers cause a RF overlap near junction of the twin chambers mentioned above. The RF overlap makes the plasma denser near the junction of the twin chambers, deposition rate faster, and film thicker at the same time; effect of the RF overlap is weak away from the junction of the twin chambers, film thickness in a single PECVD chamber is restored, the film thickness decreases along radial direction. FIG. 2 is a schematic diagram of an uneven distribution of a plasma caused by a RF overlap, which shows that the plasma near the junction of the twin chambers (inner side) is denser, and the plasma far away from the junction of the twin chambers (outer side) is sparser.

Experiment has found that in actual production, in a single-chamber PECVD process film thickness is thicker in central regions and thinner in edge regions, and the film thickness decreases outward along concentric circles; however, in processes of an apparatus with twin chambers, film thickness is thicker near junction of the twin chambers, but gradient decreases along radial direction in opposite direction, and restored to a film thickness edge gradient thinning trend in the single PECVD chamber. FIG. 3 is a schematic diagram of film thickness distribution of the film deposited by an existing apparatus with twin chambers, which shows an uneven distribution of film thickness of films on surface of wafers 12 and 22 in twin chambers 10 and 20 during production processes.

SUMMARY

The technical problem to be solved by the present disclosure is to provide an apparatus and a method for improving film thickness uniformity.

In order to achieve the above purpose, the present disclosure adopts the following technical scheme: an apparatus for improving film thickness uniformity, comprising: a PECVD machine with twin chambers, each chamber of the twin chambers comprises a wafer heating platform and a radio frequency generator respectively, and at least one of the wafer heating platforms of the chambers is a speed controlled rotating platform; wherein, the speed controlled rotating platform is rotated for integral rounds during deposition time, in order to ensure same influence of a radio frequency overlap produced by the two radio frequency generators to inner rings and outer rings of wafers adsorbed on the wafer heating platforms, so as to eliminate abrupt change of film thickness of the wafers caused by the radio frequency overlap.

Further, the twin chambers comprise a chamber A and a chamber B which are arranged side by side and connected, the chamber A comprises a wafer heating platform A and a radio frequency generator A, the chamber B comprises a wafer heating platform B and a radio frequency generator B, and both of the wafer heating platform A and the wafer heating platform B are speed controlled rotating platforms.

Further, the twin chambers comprise a chamber A and a chamber B which are arranged side by side and connected, the chamber A comprises a wafer heating platform A and a radio frequency generator A, the chamber B comprises a wafer heating platform B and a radio frequency generator B, and one of the wafer heating platform A and the wafer heating platform B is a speed controlled rotating platform.

Further, a controlled system of the PECVD machine is used to control the rotating speed of the speed controlled rotating platform, in order to limit the speed controlled rotating platform to rotate for integral rounds during deposition time.

Further, a support column is set under the speed controlled rotating platform, and the support column is coupled with a speed controlled rotating motor, a controlled system of the PECVD machine is used to control the rotating speed of the speed controlled rotating motor, in order to limit the speed controlled rotating platform coupled with the speed controlled rotating motor to rotate for integral rounds during deposition time.

Further, the support column is coupled with a rotating shaft of the speed controlled rotating motor by means of gears, key slots or tight assembling.

Further, a method for improving film thickness uniformity, wherein the method comprises: a wafer A and a wafer B are transferred to the chamber A and the chamber B respectively, and adsorbed on the wafer heating platform A and the wafer heating platform B; turning on the radio frequency generator A and the radio frequency generator B, and rotating the wafer heating platform A and the wafer heating platform B, carrying out deposition process to the wafer A and the wafer B; wherein, the wafer heating platform A and the wafer heating platform B are rotated for integral rounds respectively during deposition time, in order to ensure same influence of a radio frequency overlap produced by the two radio frequency generators to inner rings and outer rings of wafers on the wafer heating platforms, so as to eliminate abrupt change of film thickness of the wafers caused by the radio frequency overlap, local deposition rate is accelerated by the radio frequency overlap, so as to compensate for thinner film thickness of film formed in edge regions and eliminate film thickness inclines to one side in the twin chambers to improve film thickness uniformity.

Further, rotation number is set in a process menu in a controlled system of the PECVD machine, and rotating speed is calculated automatically by the controlled system according to deposition time, so as to control rotating speed of the wafer heating platform A and rotating speed of the wafer heating platform B.

Further, a method for improving film thickness uniformity, wherein the method comprises: a wafer A is transferred to the chamber A and adsorbed on the wafer heating platform A, the chamber B is idle simultaneously; turning on the radio frequency generator A and turning off the radio frequency generator B, the wafer A is processed on the static wafer heating platform A for a first deposition process; after finishing the first deposition process, the wafer A is transferred to the chamber B and adsorbed on the wafer heating platform B, a wafer B is transferred to the chamber A and adsorbed on the wafer heating platform A simultaneously; turning on the radio frequency generator A and turning off the radio frequency generator B, the wafer B is processed on the static wafer heating platform A for the first deposition process; rotating the wafer heating platform B simultaneously and the wafer A is processed for a second deposition process, the wafer A is influenced by the radio frequency generator A, a film is grown evenly on edge regions of the wafer A and film thickness of the film decreases inward along the radius of the wafer A, so as to compensate for film thickness of the edge regions which formed in the first deposition process to improve film thickness uniformity; transferring the wafer A deposited by twice depositions out of the chamber B; the wafer B is transferred to the chamber B and adsorbed on the wafer heating platform B, carrying out the second deposition process according to above processes, a wafer C is transferred to the chamber A simultaneously and adsorbed on the wafer heating platform A, carrying out the first deposition process according to above processes; repeating above processes in turns until all wafers are processed by CVD deposition processes.

Further, the method for improving film thickness uniformity, wherein rotation number is set in a process menu in a controlled system of the PECVD machine, and rotating speed is calculated automatically by the controlled system according to deposition time, so as to control rotating speed of the wafer heating platform B.

According to above technical methods, the present disclosure adopts twin chambers comprise a wafer heating platform, which is set to be a rotating platform with programmable speed control, by setting rotating speed of the platform, wafer is rotated for integral rounds within process time, so that a RF overlap between the twin chambers can form a consistent effect on edge regions of the wafer, and film around the wafer is evenly distributed, which not only eliminate abrupt change of film thickness caused by the RF overlap, but also reduce film thickness differences between edge regions and central regions of the film by a characteristic that the RF overlap improves film deposition rate, so as to ensure the film thickness more evenly in the range of the whole wafer.

It is to be understood that the above general description and the following detailed description are merely exemplary and explanatory, but do not limit the disclosure.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the disclosure as recited in the appended claims.

It is to be understood that "first," "second" and similar terms used in the specification and claims are not to represent any sequence, number or importance but only to distinguish different parts. Likewise, similar terms such as "a" or "an" also do not represent a number limit but represent "at least one". It is also to be understood that term "and/or" used in the present disclosure refers to and includes one or any or all possible combinations of multiple associated items that are listed.

Figure 4:
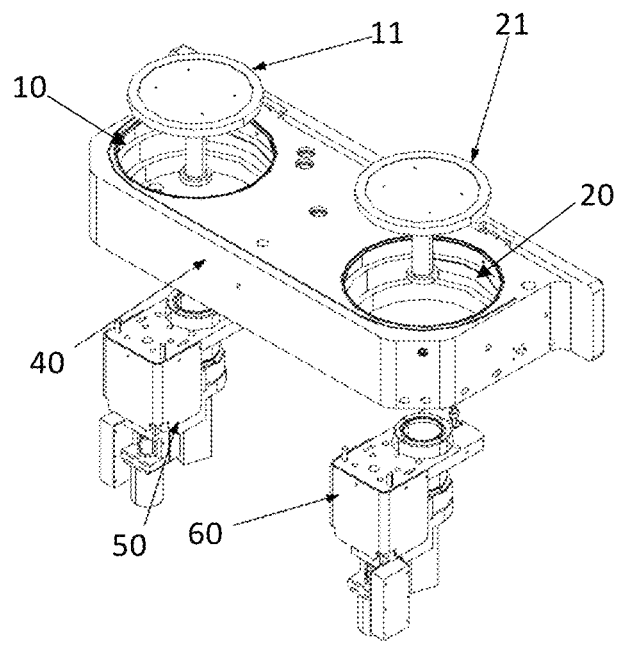
FIG. 4 is a structural decomposition diagram of an apparatus for improving film thickness uniformity according to a better exemplary embodiment.

In following specific embodiments of the present invention, refer to FIG. 4, which is a structural decomposition diagram of an apparatus for improving film thickness uniformity according to a better exemplary embodiment. Refer to FIG. 4, an apparatus for improving film thickness uniformity, comprising: a PECVD machine 40 with twin chambers 10 and 20; each chamber of 10 and 20 of the twin chambers comprises a wafer heating platform 11 and 21, a RF generator 14 and 24 respectively (not shown). For example, the twin chambers comprise a chamber A10 and a chamber B20 which are arranged side by side and connected, the chamber A10 comprises a wafer heating platform A11 and a radio frequency generator A14, the chamber B20 comprises a wafer heating platform B21 and a radio frequency generator B24.

Lifting mechanisms 50 and 60 are set respectively under each wafer heating platform 11 and 21, the lifting mechanisms 50 and 60 are used to lift up or put down wafers 12 and 22 on the wafer heating platforms 11 and 21 to realize transmission.

Figure 5:
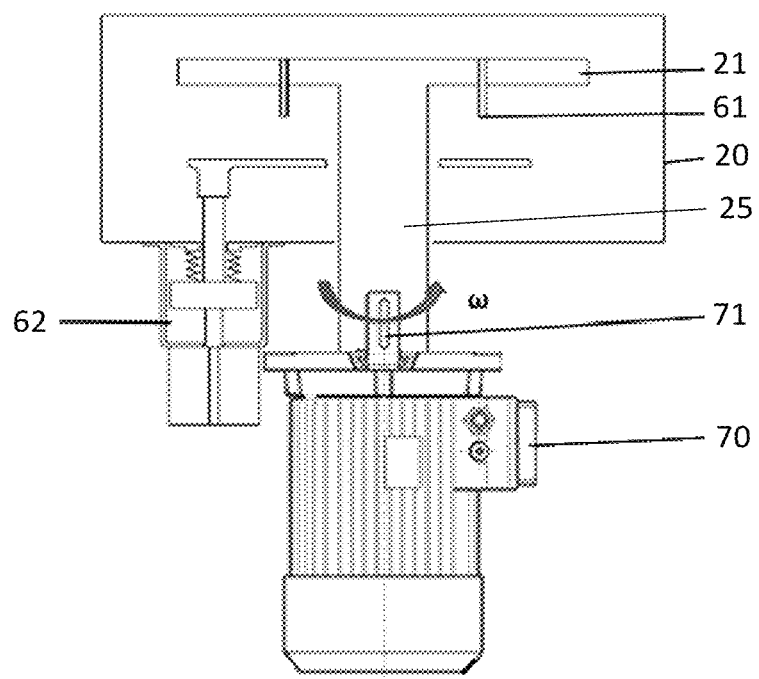
FIG. 5 is a structural diagram of a speed controlled rotating platform according to a better exemplary embodiment.

Refer to FIG. 5, which is a structural diagram of a speed controlled rotating platform according to a better exemplary embodiment. Refer to FIG. 5, at least one of the wafer heating platforms of the chambers is a speed controlled rotating platform in the twin chambers. Generally, the wafer heating platforms in the twin chambers are in a static and non-rotating state in the process. The wafer heating platforms in the twin chambers are set to be rotating platforms with programmable speed control in the present disclosure, wherein, both of the wafer heating platform A and the wafer heating platform B are set as the speed controlled rotating platforms, or one of the wafer heating platform A and the wafer heating platform B is set as a the speed controlled rotating platform, for instance, the wafer heating platform A11 in the chamber A10 is set as a static platform, and the wafer heating platform B21 in the chamber B20 is set as a speed controlled rotating platform.

Taking the chamber B20 as an example, a specific way to realize the speed controlled rotating platform is as follows: a support column 25 is set under the wafer heating platform 21 which set as the speed controlled rotating platform, and the support column 25 is coupled with a speed controlled rotating motor 70. As an optional embodiment, the supporting column can be coupled with a rotating shaft of the speed controlled rotating motor by means of gears, key slots or tight assembling. For example, the support column 25 is coupled with the speed controlled rotating motor 70 by a connected key 71, so that the wafer heating platform 21 can be controlled synchronously by the speed controlled rotating motor 70.

The lifting mechanism 60 drives a lifting rod 61 to move in a vertical direction through a lifting ring 62, and lift up or put down wafers 12 and 22 on the wafer heating platforms 11 and 21 to realize transmission (refer to prior art for understanding).

Through a control system of the PECVD machine, rotation speed of the wafer heating platform, which is set as the speed controlled rotating platform, can be limited to rotate for integral rounds during deposition time.

By setting the speed controlled rotating platform to rotate for integral rounds during deposition time, in order to ensure same influence of a RF overlap produced by the two RF generators to inner rings and outer rings of wafers adsorbed on the wafer heating platform.

A method for improving film thickness uniformity is described in details according to an exemplary embodiment and attached drawings as following.

A method for improving film thickness uniformity is used by the apparatus above for improving the film thickness uniformity, the method comprises:

Firstly, wafer heating platforms (the wafer heating platform A and the wafer heating platform B) are set as speed controlled rotating platforms in a PECVD machine with twin chambers (chamber A and chamber B). Speed controlled rotating motors are set under the platforms, and supporting columns of the platforms are coupled with rotating shafts of the speed controlled rotating motors by gears or key slots, as shown in FIG. 5.

Secondly, a wafer A and a wafer B are transferred to the chamber A and the chamber B respectively, and adsorbed on the wafer heating platform A and the wafer heating platform B.

Then turning on a radio frequency generator A and a radio frequency generator B, and rotating the wafer heating platform A and the wafer heating platform B by a control system of the PECVD machine, wafers are rotated synchronously with the wafer heating platforms, the wafer A and the wafer B are performed deposition process. Rotation number is set in a process menu in the controlled system of the PECVD machine, and rotating speed is calculated automatically by the controlled system according to deposition time, speeds of the wafer heating platform A and the wafer heating platform B are controlled and limited the heating platforms to rotate for integral rounds during deposition time, so as to ensure same influence of the RF overlap to outer rings on the wafer A and the wafer B.

By a program installation, the rotation number is set in a process menu, and the rotating speed is calculated automatically by the system according to the deposition time:

$$\omega = (2\pi * N)/\text{Dep time}$$

Wherein $\omega$: angular speed

N: rotation number (1, 2, 3 . . . )

Dep time: deposition time wherein, the wafer heating platform A and the wafer heating platform B are rotated for integral rounds respectively during deposition time, in order to ensure same influence of the RF overlap produced by the two RF generators to inner rings and outer rings of wafers on the wafer heating platforms, so as to eliminate abrupt change of film thickness of the wafers caused by the RF overlap, local deposition rate is accelerated by the RF overlap, so as to compensate for thinner film thickness of film formed in edge regions and eliminate film thickness inclines to one side in the twin chambers to improve film thickness uniformity.

Figure 1:
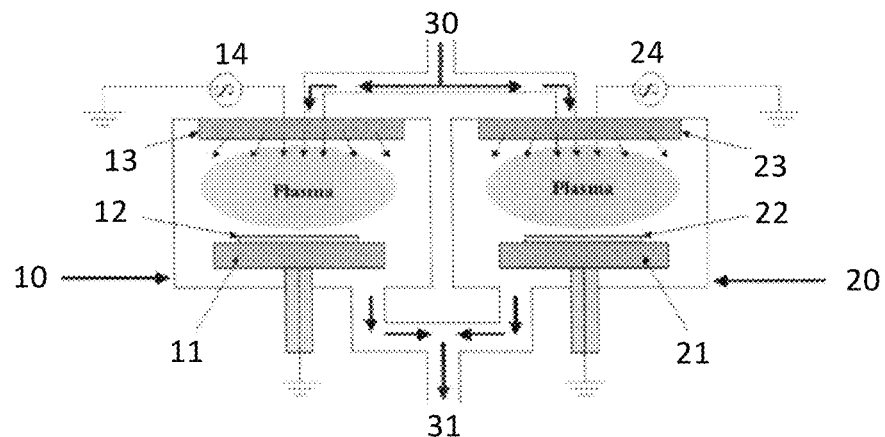
FIG. 1 is a diagram of reaction chambers of an existing PECVD machine in the prior art.
Figure 2:
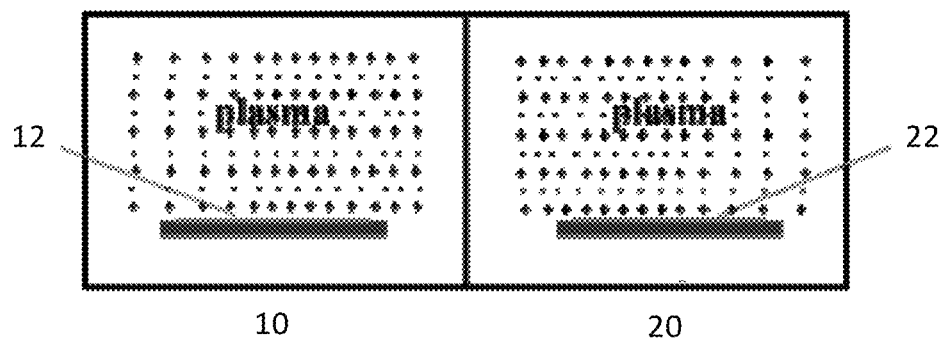
FIG. 2 is a schematic diagram of an uneven distribution of a plasma caused by a RF overlap in the prior art.
Figure 3:
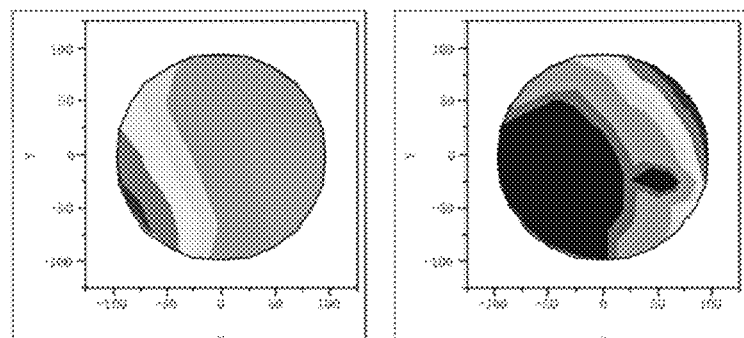
FIG. 3 is a film thickness distribution schematic diagram produced by an existing apparatus with twin chambers in the prior art.
Figure 8:
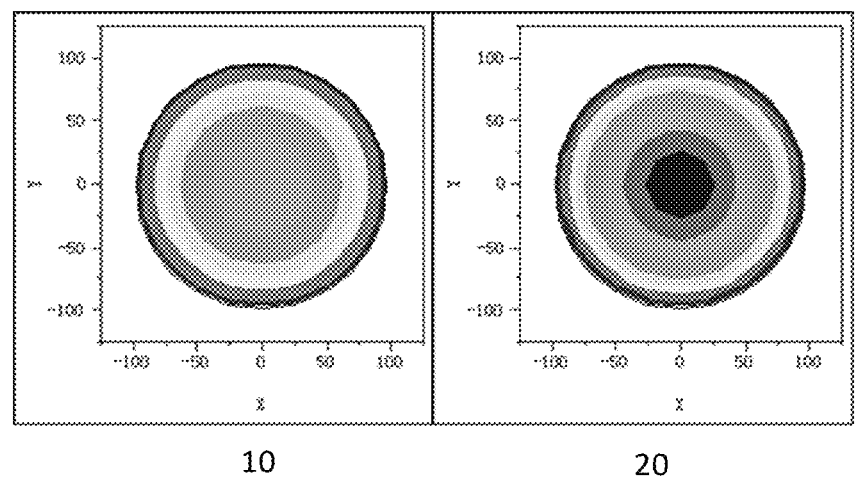
FIG. 8 is a schematic diagram of film thickness distribution produced by an apparatus with twin chambers and a method according to an exemplary embodiment.

Table 1 and table 2 are film thickness distribution data respectively produced by an existing apparatus with twin chambers according to FIG. 3 and produced by an apparatus with twin chambers according to FIG. 8 with the present disclosure.

TABLE 1 film thickness distribution data produced by an existing apparatus with twin chambers according to FIG. 3

| X | Y | Chamber B | X | Y | Chamber A |
|---|---|---|---|---|---|
| 0.0 | 0.0 | 1105 | 0.0 | 0.0 | 1091 |
| 0.0 | 32.3 | 1107 | 0.0 | 32.3 | 1082 |
| −22.9 | 22.9 | 1097 | −22.9 | 22.9 | 1091 |
| −32.3 | 0.0 | 1084 | −32.3 | 0.0 | 1096 |
| −22.9 | −22.9 | 1085 | −22.9 | −22.9 | 1097 |
| 0.0 | −32.3 | 1099 | 0.0 | −32.3 | 1093 |
| 22.9 | −22.9 | 1112 | 22.9 | −22.9 | 1084 |
| 32.3 | 0.0 | 1115 | 32.3 | 0.0 | 1077 |
| 22.9 | 22.9 | 1113 | 22.9 | 22.9 | 1075 |
| 0.0 | 64.7 | 1105 | 0.0 | 64.7 | 1070 |
| −24.7 | 59.7 | 1100 | −24.7 | 59.7 | 1081 |
| −45.7 | 45.7 | 1090 | −45.7 | 45.7 | 1088 |
| −59.7 | 24.7 | 1076 | −59.7 | 24.7 | 1096 |
| −64.7 | 0.0 | 1066 | −64.7 | 0.0 | 1095 |
| −59.7 | −24.7 | 1063 | −59.7 | −24.7 | 1096 |
| −45.7 | −45.7 | 1063 | −45.7 | −45.7 | 1097 |

TABLE 1-continued film thickness distribution data produced by an existing apparatus with twin chambers according to FIG. 3

| X | Y | Chamber B | X | Y | Chamber A |
|---|---|---|---|---|---|
| −24.7 | −59.7 | 1072 | −24.7 | −59.7 | 1092 |
| 0.0 | −64.7 | 1090 | 0.0 | −64.7 | 1088 |
| 24.7 | −59.7 | 1105 | 24.7 | −59.7 | 1082 |
| 45.7 | −45.7 | 1115 | 45.7 | −45.7 | 1074 |
| 59.7 | −24.7 | 1117 | 59.7 | −24.7 | 1096 |
| 64.7 | 0.0 | 1118 | 64.7 | 0.0 | 1067 |
| 59.7 | 24.7 | 1116 | 59.7 | 24.7 | 1063 |
| 45.7 | 45.7 | 1110 | 45.7 | 45.7 | 1062 |
| 24.7 | 59.7 | 1108 | 24.7 | 59.7 | 1061 |
| 0.0 | 97.0 | 1092 | 0.0 | 97.0 | 1059 |
| −25.1 | 93.7 | 1088 | −25.1 | 93.7 | 1063 |
| −48.5 | 84.0 | 1084 | −48.5 | 84.0 | 1066 |
| −68.6 | 68.6 | 1078 | −68.6 | 68.6 | 1070 |
| −84.0 | 48.5 | 1068 | −84.0 | 48.5 | 1077 |
| −93.7 | 25.1 | 1062 | −93.7 | 25.1 | 1086 |
| −97.0 | 0.0 | 1050 | −97.0 | 0.0 | 1088 |
| −93.7 | −25.1 | 1049 | −93.7 | −25.1 | 1090 |
| −84.0 | −48.5 | 1044 | −84.0 | −48.5 | 1090 |
| −68.6 | −68.6 | 1048 | −68.6 | −68.6 | 1090 |
| −48.5 | −84.0 | 1055 | −48.5 | −84.0 | 1088 |
| −25.1 | −93.7 | 1072 | −25.1 | −93.7 | 1085 |
| 0.0 | −97.0 | 1099 | 0.0 | −97.0 | 1088 |
| 25.1 | −93.7 | 1103 | 25.1 | −93.7 | 1073 |
| 48.5 | −84.0 | 1114 | 48.5 | −84.0 | 1068 |
| 68.6 | −68.6 | 1119 | 68.6 | −68.6 | 1062 |
| 84.0 | −48.5 | 1121 | 84.0 | −48.5 | 1055 |
| 93.7 | −25.1 | 1121 | 93.7 | −25.1 | 1054 |
| 97.0 | 0.0 | 1114 | 97.0 | 0.0 | 1048 |
| 93.7 | 25.1 | 1110 | 93.7 | 25.1 | 1047 |
| 84.0 | 48.5 | 1102 | 84.0 | 48.5 | 1045 |
| 68.6 | 68.6 | 1098 | 68.6 | 68.6 | 1046 |
| 48.5 | 84.0 | 1094 | 48.5 | 84.0 | 1048 |
| 25.1 | 93.7 | 1093 | 25.1 | 93.7 | 1052 |
| Max | | 1121 | Max | | 1097 |
| Min | | 1044 | Min | | 1045 |
| Range | | 77 | Range | | 52 |
| Uniformity | | 2.04% | Uniformity | | 1.52% |

In table 1, film thickness uniformities are: Chamber B: U %=2.04%; Chamber A: U %=1.52%, film thickness is thicker near junction of the twin chambers, but gradient decreases in opposite direction.

The theoretical data of film thickness uniformity deposited by same menu of an apparatus and a method for improving according to the present disclosure are as follows:

TABLE 2 film thickness distribution data produced by an apparatus with twin chambers and a method according to FIG. 8 with the present disclosure.

| X | Y | Chamber B | X | Y | Chamber A |
|---|---|---|---|---|---|
| 0.0 | 0.0 | 1105 | 0.0 | 0.0 | 1091 |
| 0.0 | 32.3 | 1101.5 | 0.0 | 32.3 | 1086.9 |
| −22.9 | 22.9 | 1101.5 | −22.9 | 22.9 | 1086.9 |
| −32.3 | 0.0 | 1101.5 | −32.3 | 0.0 | 1086.9 |
| −22.9 | −22.9 | 1101.5 | −22.9 | −22.9 | 1086.9 |
| 0.0 | −32.3 | 1101.5 | 0.0 | −32.3 | 1086.9 |
| 22.9 | −22.9 | 1101.5 | 22.9 | −22.9 | 1086.9 |
| 32.3 | 0.0 | 1101.5 | 32.3 | 0.0 | 1086.9 |
| 22.9 | 22.9 | 1101.5 | 22.9 | 22.9 | 1086.9 |
| 0.0 | 64.7 | 1094.6 | 0.0 | 64.7 | 1081.7 |
| −24.7 | 59.7 | 1094.6 | −24.7 | 59.7 | 1081.7 |
| −45.7 | 45.7 | 1094.6 | −45.7 | 45.7 | 1081.7 |
| −59.7 | 24.7 | 1094.6 | −59.7 | 24.7 | 1081.7 |
| −64.7 | 0.0 | 1094.6 | −64.7 | 0.0 | 1081.7 |
| −59.7 | −24.7 | 1094.6 | −59.7 | −24.7 | 1081.7 |
| −45.7 | −45.7 | 1094.6 | −45.7 | −45.7 | 1081.7 |
| −24.7 | −59.7 | 1094.6 | −24.7 | −59.7 | 1081.7 |
| 0.0 | −64.7 | 1094.6 | 0.0 | −64.7 | 1081.7 |
| 24.7 | −59.7 | 1094.6 | 24.7 | −59.7 | 1081.7 |
| 45.7 | −45.7 | 1094.6 | 45.7 | −45.7 | 1081.7 |
| 59.7 | −24.7 | 1094.6 | 59.7 | −24.7 | 1081.7 |
| 64.7 | 0.0 | 1094.6 | 64.7 | 0.0 | 1081.7 |
| 59.7 | 24.7 | 1094.6 | 59.7 | 24.7 | 1081.7 |
| 45.7 | 45.7 | 1094.6 | 45.7 | 45.7 | 1081.7 |
| 24.7 | 59.7 | 1094.6 | 24.7 | 59.7 | 1081.7 |
| 0.0 | 97.0 | 1086.6 | 0.0 | 97.0 | 1068.2 |
| −25.1 | 93.7 | 1086.6 | −25.1 | 93.7 | 1068.2 |
| −48.5 | 84.0 | 1086.6 | −48.5 | 84.0 | 1068.2 |
| −68.6 | 68.6 | 1086.6 | −68.6 | 68.6 | 1068.2 |
| −84.0 | 48.5 | 1086.6 | −84.0 | 48.5 | 1068.2 |
| −93.7 | 25.1 | 1086.6 | −93.7 | 25.1 | 1068.2 |
| −97.0 | 0.0 | 1086.6 | −97.0 | 0.0 | 1068.2 |
| −93.7 | −25.1 | 1086.6 | −93.7 | −25.1 | 1068.2 |
| −84.0 | −48.5 | 1086.6 | −84.0 | −48.5 | 1068.2 |
| −68.6 | −68.6 | 1086.6 | −68.6 | −68.6 | 1068.2 |
| −48.5 | −84.0 | 1086.6 | −48.5 | −84.0 | 1068.2 |
| −25.1 | −93.7 | 1086.6 | −25.1 | −93.7 | 1068.2 |
| 0.0 | −97.0 | 1086.6 | 0.0 | −97.0 | 1068.2 |
| 25.1 | −93.7 | 1086.6 | 25.1 | −93.7 | 1068.2 |
| 48.5 | −84.0 | 1086.6 | 48.5 | −84.0 | 1068.2 |
| 68.6 | −68.6 | 1086.6 | 68.6 | −68.6 | 1068.2 |
| 84.0 | −48.5 | 1086.6 | 84.0 | −48.5 | 1068.2 |
| 93.7 | −25.1 | 1086.6 | 93.7 | −25.1 | 1068.2 |
| 97.0 | 0.0 | 1086.6 | 97.0 | 0.0 | 1068.2 |
| 93.7 | 25.1 | 1086.6 | 93.7 | 25.1 | 1068.2 |
| 84.0 | 48.5 | 1086.6 | 84.0 | 48.5 | 1068.2 |
| 68.6 | 68.6 | 1086.6 | 68.6 | 68.6 | 1068.2 |
| 48.5 | 84.0 | 1086.6 | 48.5 | 84.0 | 1068.2 |
| 25.1 | 93.7 | 1086.6 | 25.1 | 93.7 | 1068.2 |
| Max | | 1105 | Max | | 1091 |
| Min | | 1086.6 | Min | | 1068.2 |
| Range | | 18. | Range | | 22.8 |
| Uniformity | | 0.54% | Uniformity | | 0.75% |

In table 2, film thickness uniformities are: Chamber B: U %=0.54%; Chamber A: U %=0.75%, which improved significantly than the film thickness uniformities in table 1, and increase rate is more than 51%.

Figure 6:
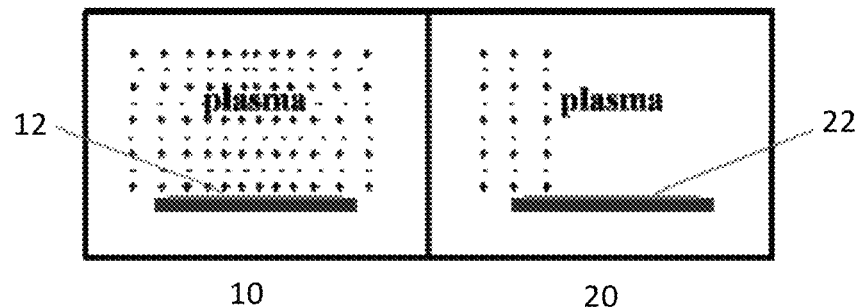
FIG. 6 is a schematic diagram of a distribution of a plasma in a single chamber with RF turned on in twin chambers.

Due to influence on an adjacent chamber caused by incomplete RF shielding, when a chamber is performed with RF, and RF of the other chamber is set to 0, and gas conditions are same on both chambers, plasma distribution is shown in FIG. 6. In FIG. 6, chamber A10 is performed with RF normally, plasma density is large in central regions and small in edge regions, and RF of a chamber B20 is set to 0, for the RF overflow of the chamber A10, a certain degree of gas molecules are ionized in the chamber B20 close to the chamber A10, thus a plasma with a certain density exists.

According to the situation, the present invention also provides a method for improving film thickness uniformity, and an apparatus for improving film thickness uniformity can also be used as a supplementary scheme to the above method.

The method (the supplementary scheme) may specifically comprises:

A heating platform of a chamber of twin chambers is designed by adding a speed controlled rotating motor according to above method; for example, a speed controlled rotating motor is installed under a wafer heating platform B, which set as a speed controlled rotating platform, and a wafer heating platform A remains an original structure. By setting rotation number in a process menu of a control system of a PECVD machine, and rotating speed is calculated automatically according to deposition time by a control system, speed of the wafer heating platform B is controlled by a program, uneven film thickness distribution is solved by control of sequential transmission. RF power of a chamber B is set to 0 through a condition menu, gas flow rate of the chamber B is as same as gas flow rate of a chamber A.

Figure 7:
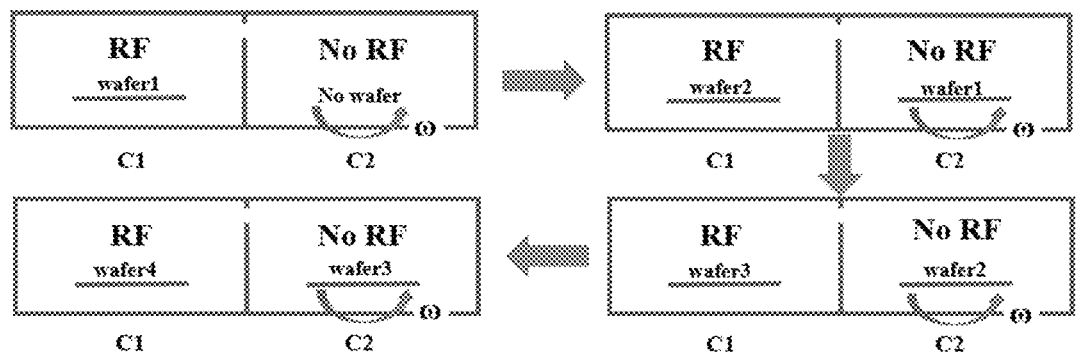
FIG. 7 is a schematic diagram of a transmission method according to a better exemplary embodiment.

Refer to FIG. 7, which is a schematic diagram of a transmission method. Firstly, a wafer A (wafer 1) is transferred into chamber A (C1) and adsorbed on a wafer heating platform A by control of sequential transmission. And chamber B (C2) is idle, that is, no wafer is carried to the chamber B.

Secondly, turning on RF generator A, and the chamber A is performed with RF, turning off RF generator B, and RF of the chamber B is set to 0 (no RF), a wafer A (wafer 1) is processed on a static wafer heating platform A for a first deposition process; that is, a normal CVD process is performed to the wafer A to form a film normally.

After finishing the first deposition process of the wafer A, the wafer A is transferred to the chamber B and adsorbed on a wafer heating platform B; a wafer B (wafer 2) is transferred to the chamber A and adsorbed on the wafer heating platform A simultaneously Turning on the RF generator A, and turning off the RF generator B, the wafer B is processed on the static wafer heating platform A for the first deposition process; that is, the normal CVD process is performed to the wafer B to form a film normally. Rotating the wafer heating platform B with an angular speed (ω) simultaneously and the wafer A is processed for a second deposition process.

The wafer A is influenced by RF effect of the RF generator A of the chamber A, a film is grown evenly on the edge regions of the wafer A and film thickness of the film decreases inward along the radius of the wafer A, so as to compensate for film thickness of the edge regions which formed in the first deposition process to improve film thickness uniformity.

Then, transferring the wafer A deposited twice out of the chamber B.

The wafer B is transferred to the chamber B and adsorbed on the wafer heating platform B, rotating the wafer heating platform B and carrying out the second deposition process to the wafer B according to above processes; a wafer C (wafer 3) is transferred to the chamber A simultaneously and adsorbed on the static wafer heating platform A, carrying out the first deposition process according to above processes to the wafer C and carrying out a secondly round of disposition.

Repeating above processes in turn until CVD deposition process of all wafers (including wafer 4) is completed.

After twice depositions by passing through the chamber A and the chamber B, a film with good film thickness uniformity can be formed, refer to FIG. 8.

According to above technical methods, the present disclosure adopts twin chambers comprise a wafer heating platform, which is set to be a rotating platform with programmable speed control, by setting rotating speed of the platform, wafer is rotated for integral rounds within process time, so that influence of the RF overlap between the twin chambers can form a consistent effect on edge regions of the wafer, and film around the wafer is evenly distributed, which not only eliminate abrupt change of film thickness caused by the RF overlap, but also reduce film thickness differences between edge regions and central regions of the film by a characteristic that the RF overlap improves film deposition rate, so as to ensure the film thickness more evenly in the range of the whole wafer.

It will be appreciated that the disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. An apparatus for improving film thickness uniformity, comprising: a PECVD machine with twin chambers, each chamber of the twin chambers comprises a wafer heating platform and a radio frequency generator respectively, and at least one of the wafer heating platforms of the chambers is a speed controlled rotating platform; wherein, the speed controlled rotating platform is rotated for integral rounds during deposition time, in order to ensure same influence of a radio frequency overlap produced by the two radio frequency generators to inner rings and outer rings of wafers adsorbed on the wafer heating platforms, so as to eliminate abrupt change of film thickness of the wafers caused by the radio frequency overlap;

wherein, the twin chambers comprise a chamber A and a chamber B which are arranged side by side and connected, the chamber A comprises a wafer heating platform A and a radio frequency generator A, the chamber B comprises a wafer heating platform B and a radio frequency generator B, junction of the chamber A and the chamber B is an opening channel, and the opening channel is located above the wafer heating platform A and the wafer heating platform B; a wafer A and a wafer B are transferred to the chamber A and the chamber B respectively, and adsorbed on the wafer heating platform A and the wafer heating platform B for deposition processes.

2. The apparatus of claim 1, wherein both of the wafer heating platform A and the wafer heating platform B are speed controlled rotating platforms, when turning on the radio frequency generator A of the chamber A, and turning off the radio frequency generator B of the chamber B, a plasma produced by the radio frequency generator A overflows into the chamber B through the opening channel; or, when turning on the radio frequency generator B of the chamber B, and turning off the radio frequency generator A of the chamber A, a plasma produced by the radio frequency generator B overflows into the chamber A through the opening channel; or, when turning on the radio frequency generator A of the chamber A, and turning on the radio frequency generator B of the chamber B, the plasma produced by the radio frequency generator A overflows into the chamber B through the opening channel, and the plasma produced by the radio frequency generator B overflows into the chamber A through the opening channel.

3. The apparatus of claim 1, wherein one of the wafer heating platform A and the wafer heating platform B is a speed controlled rotating platform; the wafer heating platform A is the speed controlled rotating platform, when turning on the radio frequency generator A of the chamber A, and turning off the radio frequency generator B of the chamber B, a plasma produced by the radio frequency generator A overflows into the chamber B through the opening channel; or, the wafer heating platform B is the speed controlled rotating platform, when turning on the radio frequency generator B of the chamber B, and turning off the radio frequency generator A of the chamber A, a plasma produced by the radio frequency generator B overflows into the chamber A through the opening channel.

4. The apparatus of claim 2, wherein a controlled system of the PECVD machine is used to control rotating speed of the speed controlled rotating platform, in order to limit the speed controlled rotating platform to rotate for integral rounds during deposition time.

5. The apparatus according to any one of claim 1, wherein a support column is set under the speed controlled rotating platform, and the support column is coupled with a speed controlled rotating motor, a controlled system of the PECVD machine is used to control the rotating speed of the speed controlled rotating motor, in order to limit the speed controlled rotating platform coupled with the speed controlled rotating motor to rotate for a integer round during deposition time.

6. The apparatus of claim 5, wherein the support column is coupled with a rotating shaft of the speed controlled rotating motor by means of gears, key slots or tight assembling.

7. A method for improving film thickness uniformity by the apparatus of claim 2, comprises:
the wafer A and the wafer B are transferred to the chamber A and the chamber B respectively, and adsorbed on the wafer heating platform A and the wafer heating platform B;
turning on the radio frequency generator A and the radio frequency generator B, and rotating the wafer heating platform A and the wafer heating platform B, carrying out deposition process to the wafer A and the wafer B;
wherein, the wafer heating platform A and the wafer heating platform B are rotated for integral rounds respectively during deposition time, in order to ensure same influence of a radio frequency overlap produced by the two radio frequency generators to inner rings and outer rings of wafers on the wafer heating platforms, so as to eliminate abrupt change of film thickness of the wafers caused by the radio frequency overlap, local deposition rate is accelerated by the radio frequency overlap, so as to compensate for thinner film thickness of film formed in edge regions and eliminate film thickness inclines to one side in the twin chambers to improve film thickness uniformity.

8. The method of claim 7, wherein rotation number is set in a process menu in a controlled system of the PECVD machine, and rotating speed is calculated automatically by the controlled system according to deposition time, so as to control rotating speed of the wafer heating platform A and rotating speed of the wafer heating platform B.

9. A method for improving film thickness uniformity by the apparatus of claim 3, comprising:
the wafer A is transferred to the chamber A and adsorbed on the wafer heating platform A, the chamber B is idle simultaneously;
turning on the radio frequency generator A and turning off the radio frequency generator B, the wafer A is processed on the static wafer heating platform A for a first deposition process;
after finishing the first deposition process, the wafer A is transferred to the chamber B and adsorbed on the wafer heating platform B, the wafer B is transferred to the chamber A and adsorbed on the wafer heating platform A simultaneously;
turning on the radio frequency generator A and turning off the radio frequency generator B, the wafer B is processed on the static wafer heating platform A for the first deposition process; rotating the wafer heating platform B simultaneously and the wafer A is processed for a second deposition process, the wafer A is influenced by the radio frequency generator A, a film is grown evenly on edge regions of the wafer A and film thickness of the film decreases inward along the radius of the wafer A, so as to compensate for film thickness of the edge regions which formed in the first deposition process to improve film thickness uniformity;
transferring the wafer A deposited by twice depositions out of the chamber B;
the wafer B is transferred to the chamber B and adsorbed on the wafer heating platform B, carrying out the second deposition process according to above processes, a wafer C is transferred to the chamber A simultaneously and adsorbed on the wafer heating platform A, carrying out the first deposition process according to above processes;
repeating above processes in turns until all wafers are processed by CVD deposition processes.

10. The method of claim 9, wherein rotation number is set in a process menu in a controlled system of the PECVD machine, and rotating speed is calculated automatically by the controlled system according to deposition time, so as to control rotating speed of the wafer heating platform B.

11. The apparatus of claim 3, wherein a controlled system of the PECVD machine is used to control rotating speed of the speed controlled rotating platform, in order to limit the speed controlled rotating platform to rotate for integral rounds during deposition time.

12. The apparatus of claim 2, wherein a support column is set under the speed controlled rotating platform, and the support column is coupled with a speed controlled rotating motor, a controlled system of the PECVD machine is used to control the rotating speed of the speed controlled rotating motor, in order to limit the speed controlled rotating platform coupled with the speed controlled rotating motor to rotate for a integer round during deposition time.

13. The apparatus of claim 12, wherein the support column is coupled with a rotating shaft of the speed controlled rotating motor by means of gears, key slots or tight assembling.

14. The apparatus of claim 3, wherein a support column is set under the speed controlled rotating platform, and the support column is coupled with a speed controlled rotating motor, a controlled system of the PECVD machine is used to control the rotating speed of the speed controlled rotating motor, in order to limit the speed controlled rotating platform coupled with the speed controlled rotating motor to rotate for a integer round during deposition time.

15. The apparatus of claim 14, wherein the support column is coupled with a rotating shaft of the speed controlled rotating motor by means of gears, key slots or tight assembling.

\* \* \* \* \*